US012584210B2

(12) United States Patent (10) Patent No.: US 12,584,210 B2
Ko et al. (45) Date of Patent: Mar. 24, 2026

(54) DEPOSITION APPARATUS

(71) Applicant: SAMSUNG DISPLAY CO., LTD., Yongin-si (KR)

(72) Inventors: Jun Hyeuk Ko, Yongin-si (KR); Jae Suk Moon, Yongin-si (KR); Min Goo Kang, Yongin-si (KR); Eui Gyu Kim, Yongin-si (KR); Min Chul Song, Yongin-si (KR); Suk Ha Ryu, Yongin-si (KR); Young Sun Cho, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 413 days.

(21) Appl. No.: 18/203,702

(22) Filed: May 31, 2023

(65) Prior Publication Data

US 2024/0060172 A1     Feb. 22, 2024

(30) Foreign Application Priority Data

Aug. 18, 2022     (KR) ........................ 10-2022-0103609

(51) Int. Cl.
*C23C 14/50* (2006.01)
*C23C 14/04* (2006.01)
*C23C 14/24* (2006.01)

(52) U.S. Cl.
CPC ............ *C23C 14/50* (2013.01); *C23C 14/042* (2013.01); *C23C 14/24* (2013.01)

(58) Field of Classification Search
None
See application file for complete search history.

(56) References Cited

U.S. PATENT DOCUMENTS

2020/0013658 A1*   1/2020   Ko ..................... H01L 21/67092
2020/0090913 A1*   3/2020   Wilby ..................... C23C 14/35
2022/0380888 A1*   12/2022   Yoshidome ......... H01J 37/3452

FOREIGN PATENT DOCUMENTS

KR         100839380 B1     6/2008
KR         100994490 B1     11/2010
KR         101649905 B1     8/2016
KR         101953038 B1     2/2019
KR      1020200004940 A     1/2020

* cited by examiner

*Primary Examiner* — Jason Berman
(74) *Attorney, Agent, or Firm* — CANTOR COLBURN LLP

(57) ABSTRACT

A deposition apparatus for depositing a deposition material on a base substrate disposed on a mask, includes: a mask assembly including a mask frame which defines an opening therein and surrounds the opening, and the mask disposed on the mask frame; an electrostatic chuck disposed on the base substrate; and a plate disposed on the electrostatic chuck. The electrostatic chuck includes a plurality of magnetic bodies, and a magnetic property of at least one magnetic body among the plurality of magnetic bodies is different from a magnetic property of remaining magnetic bodies except for the at least one magnetic body among the plurality of magnetic bodies.

19 Claims, 10 Drawing Sheets

MGA

MGA_S    MG2_1    MGA_C    MG1_1    MGA_S    MG2_1

DEPOSITION APPARATUS

This application claims priority to Korean patent application number 10-2022-0103609, filed on Aug. 18, 2022, and all the benefits accruing therefrom under 35 U.S.C. § 119, the content of which in its entirety is herein incorporated by reference.

BACKGROUND

1. Technical Field

The present disclosure generally relates to a deposition apparatus.

2. Related Art

A display device may include pixels. A light emitting element included in each of the pixels may include electrodes spaced apart from each other and a light emitting layer disposed between the electrodes. The electrodes and the light emitting layer may be formed by using several methods. Among these methods, an independent deposition method is a method in which a mask (e.g., a fine metal mask ("FMM")) is stretched and then adhered closely to a mask frame, and a deposition material is deposited on a surface to be deposited.

SUMMARY

Embodiments provide a deposition apparatus capable of improving a process variation and a yield.

In accordance with an aspect of the present disclosure, there is provided a deposition apparatus for depositing a deposition material on a base substrate disposed on a mask, the deposition apparatus including: a mask assembly including a mask frame which defines an opening therein and surrounds the opening, and the mask disposed on the mask frame; an electrostatic chuck disposed on the base substrate; and a plate disposed on the electrostatic chuck. The electrostatic chuck includes a plurality of magnetic bodies, and a magnetic property of at least one magnetic body among the plurality of magnetic bodies is different from a magnetic property of the other magnetic bodies among the plurality of magnetic bodies.

The electrostatic chuck may include a magnetic area. The magnetic area may include: a first area corresponding to a central area of the magnetic area; and a second area disposed at one side of the first area.

The plurality of magnetic bodies may include a first magnetic body disposed in the first area and a second magnetic body disposed in the second area. A magnetic property of the first magnetic body may be greater than a magnetic property of the second magnetic body.

A magnetic permeability of the first magnetic body may be greater than a magnetic permeability of the second magnetic body.

A magnetic susceptibility of the first magnetic body may be greater than a magnetic susceptibility of the second magnetic body.

In a plan view, the magnetic area may overlap with the plate.

The plate may include a permanent magnet.

The electrostatic chuck may define a plurality of internal grooves therein. The magnetic bodies may be disposed in the internal grooves, respectively.

The electrostatic chuck may include a first surface facing the plate and a second surface as the opposite surface of the first surface. The magnetic bodies may be disposed closer to the first surface than the second surface.

The magnetic bodies may be disposed while being spaced apart from the first surface at a certain distance.

Each of the magnetic bodies may include a third surface facing the plate and a fourth surface as the opposite surface of the third surface. The third surface and the first surface may exist on the same plane.

A size of each of the at least one magnetic body may be different from a size of each of the other magnetic bodies.

In accordance with another aspect of the present disclosure, there is provided a deposition apparatus for depositing a deposition material on a base substrate disposed on a mask, the deposition apparatus including: a mask assembly including a mask frame which defines an opening therein and surrounds the opening, and the mask disposed on the mask frame; an electrostatic chuck disposed on the base substrate; and a plate disposed on the electrostatic chuck. The electrostatic chuck includes a plurality of magnetic bodies, and a size of each of at least one magnetic body among the plurality of magnetic bodies is different from a size of the other magnetic bodies among the plurality of magnetic bodies.

The electrostatic chuck may include a magnetic area. The magnetic area may include: a first area corresponding to a central area of the magnetic area; and a second area disposed at one side of the first area.

The plurality of magnetic bodies may include a first magnetic body disposed in the first area and a second magnetic body disposed in the second area. A size of the first magnetic body may be greater than a size of the second magnetic body.

In a plan view, the magnetic area may overlap with the plate.

The electrostatic chuck may include a first surface facing the plate and a second surface as the opposite surface of the first surface. The magnetic bodies may be disposed closer to the first surface than the second surface.

The magnetic bodies may be disposed while being spaced apart from the first surface at a certain distance.

Each of the magnetic bodies may include a third surface facing the plate and a fourth surface as the opposite surface of the third surface. The third surface and the first surface may exist on the same plane.

A magnetic property of the at least one magnetic body may be different from a magnetic property of the other magnetic bodies.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 1 is a sectional view schematically illustrating a deposition apparatus in accordance with embodiments of the present disclosure.

FIGS. 4A and 4B are perspective views schematically illustrating an example of the electrostatic chuck and a plate, which are included in the deposition apparatus shown in FIG. 1.

FIG. 7 is a plan view schematically illustrating another example of the electrostatic chuck included in the deposition apparatus shown in FIG. 1.

FIG. 8 is a sectional view schematically illustrating a deposition apparatus in accordance with embodiments of the present disclosure.

FIG. 9 is a sectional view schematically illustrating a deposition apparatus in accordance with embodiments of the present disclosure.

DETAILED DESCRIPTION

Figure 2:
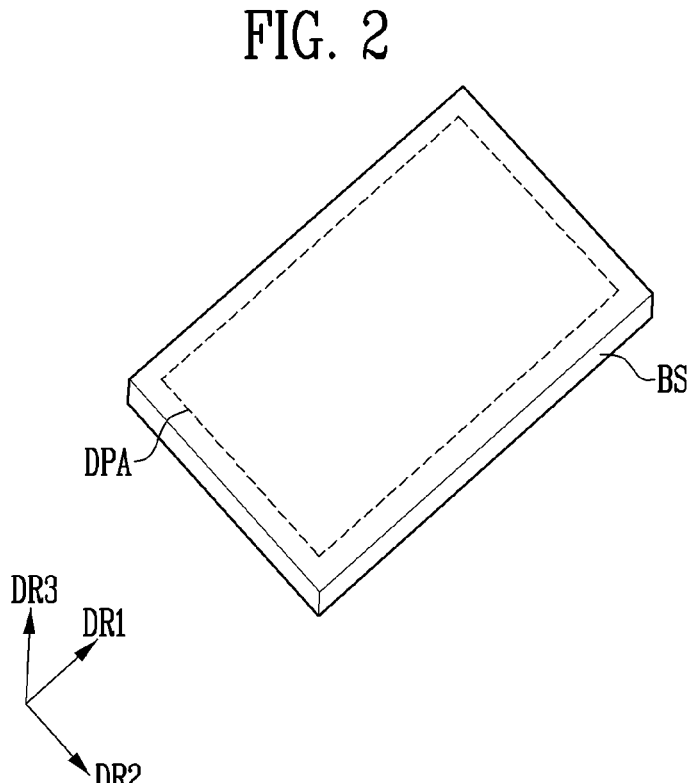
FIG. 2 is a perspective view illustrating an example of a base substrate as a deposition target of the deposition apparatus shown in FIG. 1.

Like numbers refer to like elements throughout. In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise. In the following description, singular forms in the present disclosure are intended to include the plural forms as well, unless the context clearly indicates otherwise.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof.

In the entire specification, when an element is referred to as being "connected" or "coupled" to another element, it can be directly connected or coupled to the another element or be indirectly connected or coupled to the another element with one or more intervening elements interposed therebetween.

Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

Hereinafter, exemplary embodiments of the present disclosure will be described in more detail with reference to the accompanying drawings. Throughout the drawings, the same reference numerals are given to the same elements, and their overlapping descriptions will be omitted.

Figure 1:
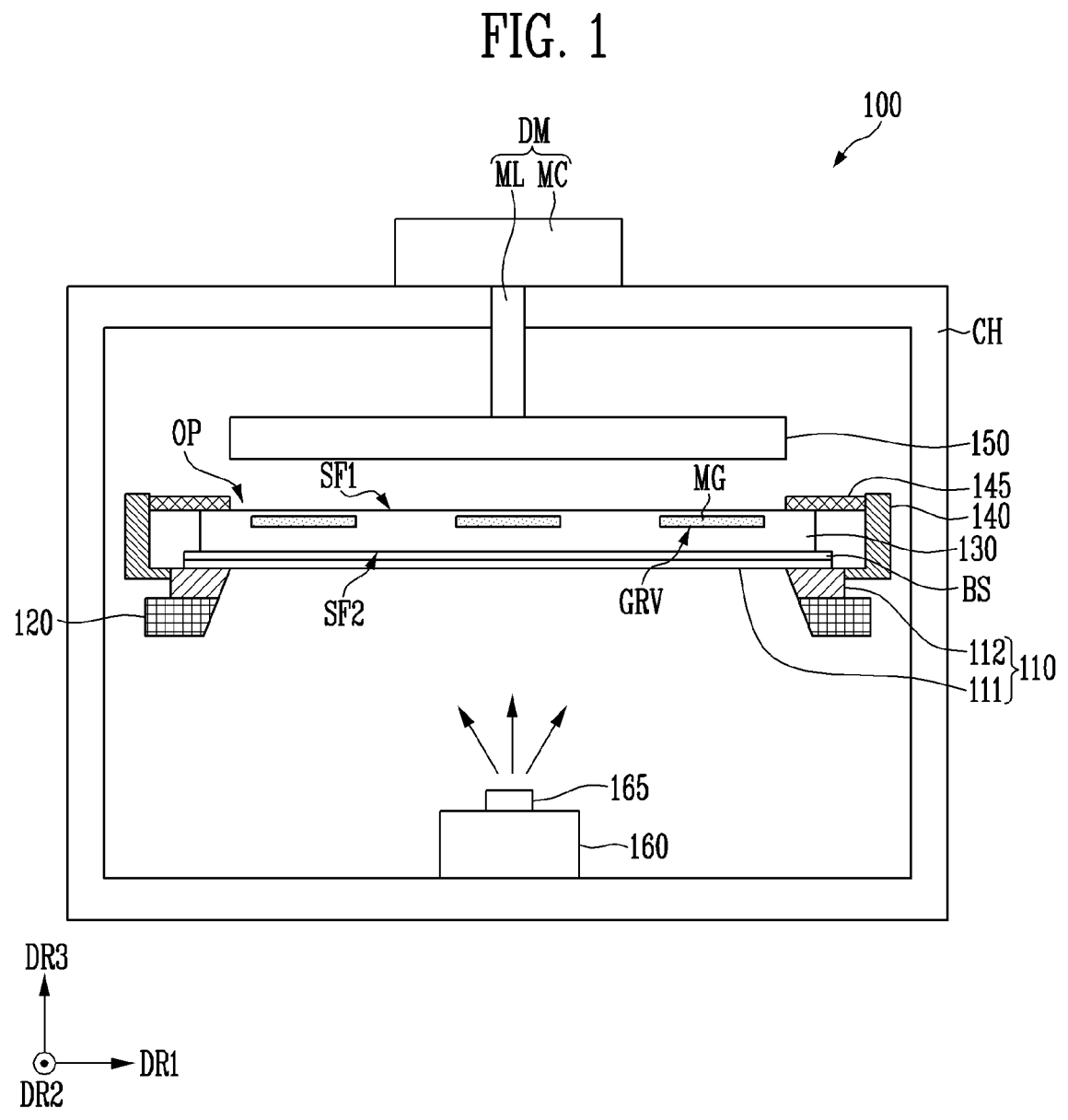
Figure 3:
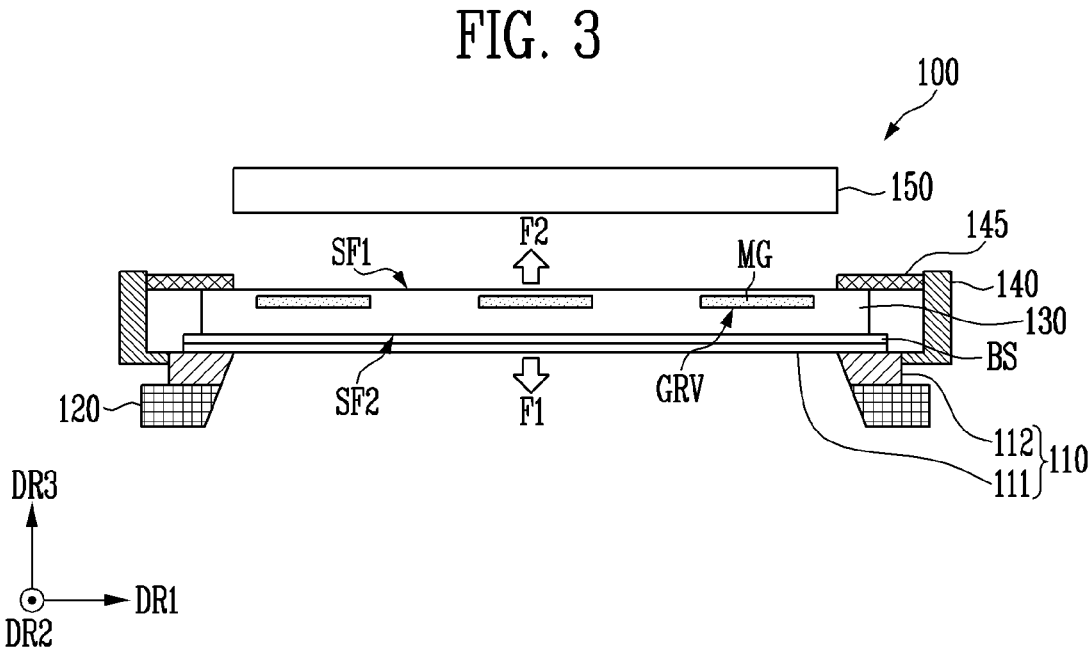
FIG. 3 is a view illustrating an external force applied to a mask and an electrostatic chuck, which are included in the deposition apparatus shown in FIG. 1 in a deposition process.
Figure 4A:
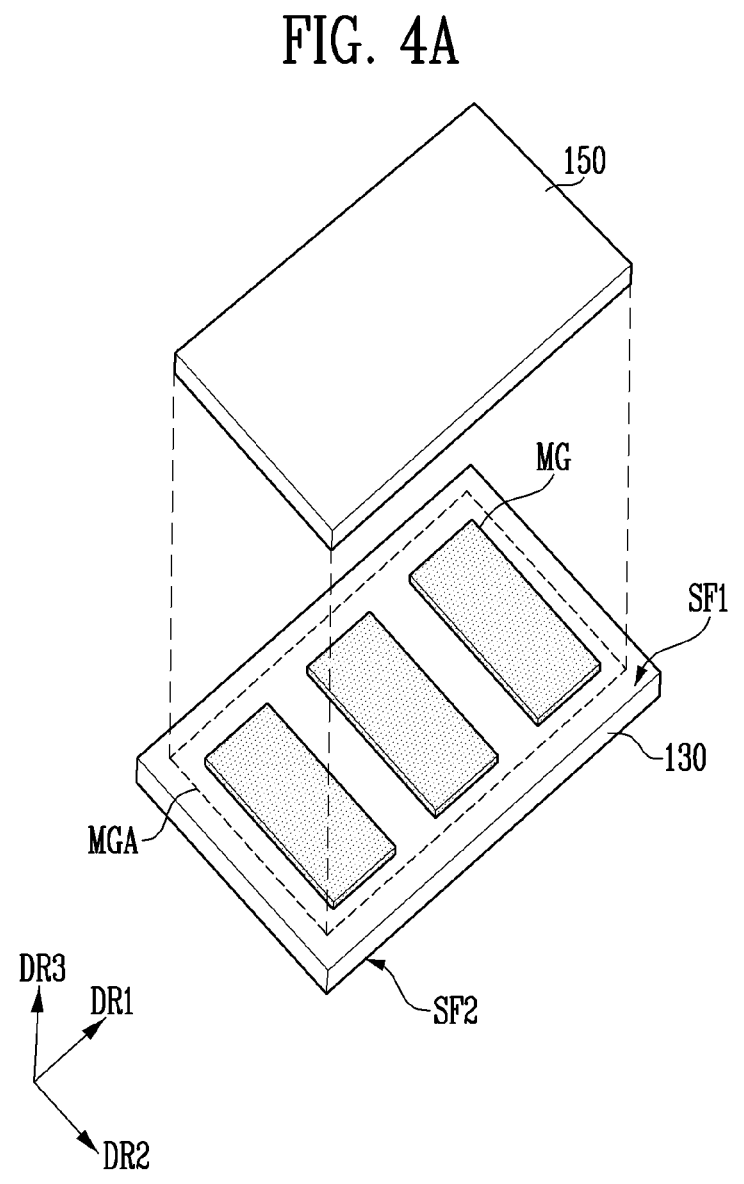
Figure 4B:
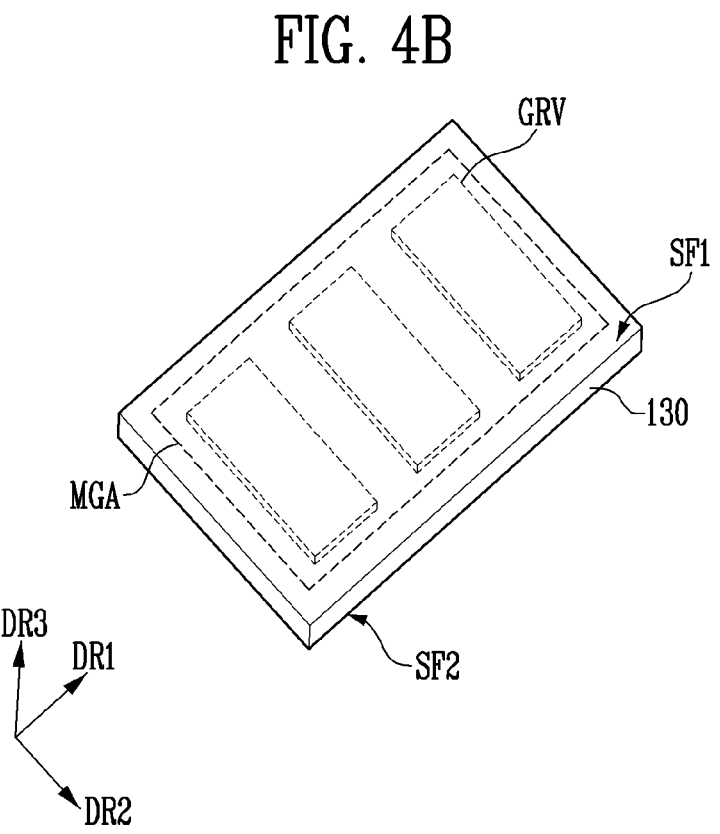
Figure 5:
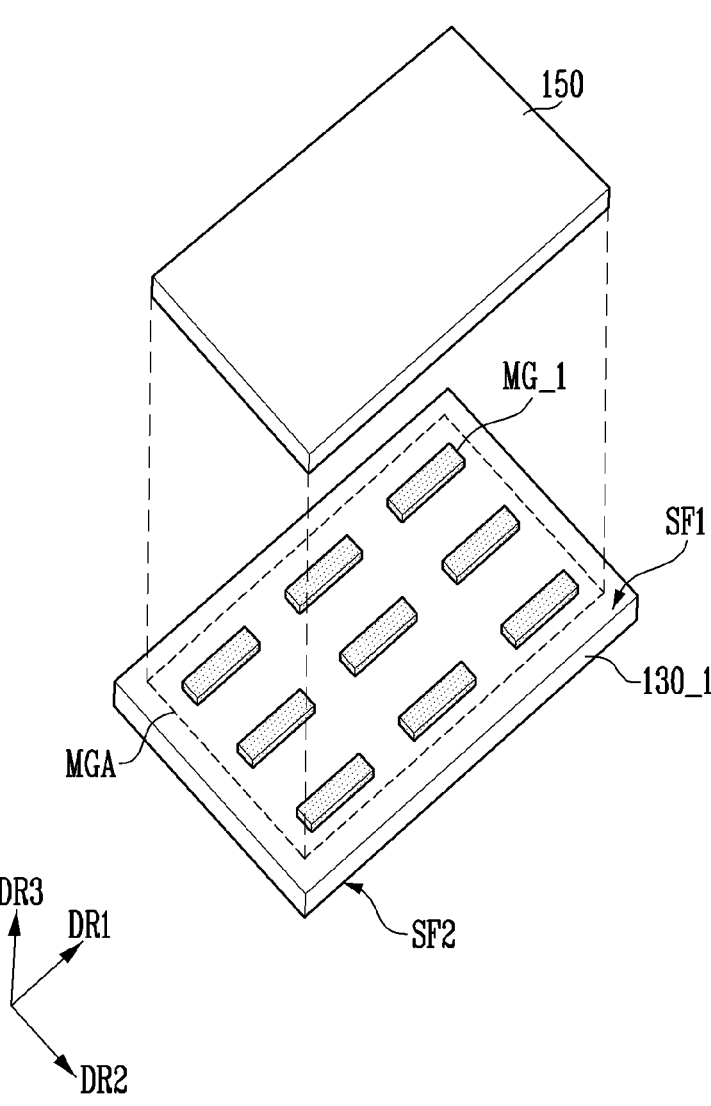
FIG. 5 is a perspective schematically illustrating an example of the electrostatic chuck and the plate, which are included in the deposition apparatus shown in FIG. 1.

FIG. 1 is a sectional view schematically illustrating a deposition apparatus in accordance with embodiments of the present disclosure. FIG. 2 is a perspective view illustrating an example of a base substrate as a deposition target of the deposition apparatus shown in FIG. 1. FIG. 3 is a view illustrating an external force applied to a mask and an electrostatic chuck, which are included in the deposition apparatus shown in FIG. 1 in a deposition process. FIGS. 4A and 4B are perspective views schematically illustrating an example of the electrostatic chuck and a plate, which are included in the deposition apparatus shown in FIG. 1. FIG. 5 is a perspective schematically illustrating an example of the electrostatic chuck and the plate, which are included in the deposition apparatus shown in FIG. 1.

Referring to FIG. 1, the deposition apparatus 100 in accordance with the embodiments of the present disclosure may deposit a deposition material on a base substrate BS.

For example, further referring to FIG. 2, the base substrate BS may include a deposition area DPA, and the deposition material may be deposited on the deposition area DPA. For convenience of description, a case where the base substrate BS includes one deposition area DPA is illustrated in FIG. 2. However, this is merely illustrative, and the base substrate BS may include a plurality of deposition areas DPA. In addition, the size and shape of the deposition area DPA of the base substrate BS shown in FIG. 2 are merely illustrative for convenience of description. The size and shape of the deposition area DPA may be variously set according to a deposition process.

The deposition area DPA of the base substrate BS may be parallel to a surface defined by a first directional axis (i.e., an axis extending in a first direction DR1) and a second directional axis (i.e., an axis extending in a second direction DR2). In addition, a normal direction of the deposition area DPA may be defined as a third direction DR3. The first to third directions DR1, DR2, and DR3 shown in the drawing are merely an example defined for convenience of description. The first to third directions DR1, DR2, and DR3 are relative concepts, and may be converted into other directions. Hereinafter, for convenience of description, the first to third directions DR1, DR2, and DR3 are designated by like reference numerals.

Referring back to FIG. 1, in an embodiment, the deposition apparatus 100 may include a chamber CM, a transfer part DM, a mask assembly 110, a support member 120 (or support part), an electrostatic chuck ("ESC") 130, a driving part 140, a connection member 145 (or connection part), a plate 150 (or first plate), and a deposition source 160.

A space may be formed inside the chamber CH, and the deposition process may be performed in the space formed inside the chamber CH. For example, the mask assembly 110, the support member 120, the electrostatic chuck 130, the driving part 140, the connection member 145, the plate 150, the deposition source 160, a transfer rod ML of the transfer part DM may be disposed in the space formed inside the chamber CH.

Although not separately shown in FIG. 1, the chamber CH may be formed such that at least a portion thereof is opened. In some embodiments, a gate valve or the like may be disposed at the opened portion of the chamber CH, and the opened portion of the chamber CH may be opened or closed through the gate valve or the like.

The support member 120 may support and fix the mask assembly 110. Also, the support member 120 may allow the mask assembly 110 to ascend/descend within a certain distance range or allow the mask assembly 110 to be rotated within a certain angle range. Also, the support member 120 may allow the mask assembly 110 to be linearly moved in various directions with a certain distance range.

The mask assembly 110 may be disposed on the support member 120.

The mask assembly 110 may include a mask 111 and a mask frame 112. For example, the mask 111 may include a fine metal mask (FMM). In addition, the mask frame 112 may define an opening through which the deposition material can pass, and include a plurality of frames surrounding the opening.

In an embodiment, the mask frame 112 may further include a support stick. The support stick may prevent a warpage phenomenon due to self-weight of the mask 111, and function to support the mask frame 112.

The mask 111 may be disposed on the top of the mask frame 112. In some embodiments, one mask 111 may be disposed on the mask frame 112, or a plurality of masks 111 may be disposed on the mask frame 112.

When a plurality of masks 111 are disposed on the mask frame 112, the plurality of masks 111 may be arranged in one direction (e.g., the first direction DR1 or the second direction DR2), to close at least a portion of the opening defined in the mask frame 112. For convenience of description, hereinafter, a case where one mask 111 is provided to be disposed on the mask frame 112 and close at least a portion of the opening of the mask frame 112 will be mainly described.

In an embodiment, the mask 111 may define at least one opening therein. When the opening is provided in plurality, the plurality of openings may be disposed such that a pattern is formed at at least a portion of the mask 111. Also, when the opening is provided in plurality, the plurality of openings may be disposed to be distinguished from each other in a plurality of areas of the mask 111, and be disposed such that a pattern is formed in each area.

The base substrate BS on which the deposition material is deposited may be disposed on the mask assembly 110. The base substrate BS may be a mother substrate which becomes a deposition target.

The deposition area DPA of the base substrate SUB may be defined as an area corresponding to the at least one opening defined in the mask 111 of the mask assembly 110. Accordingly, an area exposed on the base substrate BS by the at least one opening formed in the mask 111 may be defined as the deposition area DPA, and an area covered by the mask may be defined as a non-deposition area.

The electrostatic chuck 130 may be disposed on the base substrate BS. The electrostatic chuck 130 may function to allow the base substrate BS to be fixed by using an electrostatic force and to allow the base substrate BS to be adhered closely to the mask 111. The electrostatic chuck 130 may be coupled to the base substrate BS to prevent the base substrate BS from moving in alignment in the deposition process and deposition of the deposition material. Also, the electrostatic chuck 130 may prevent the base substrate BS from being lifted by a gas filled between the electrostatic chuck 130 and the base substrate BS, which is leaked to the outside.

For example, the electrostatic chuck 130 may include a plurality of electrodes disposed thereinside. The plurality of electrodes may include at least one first electrode and at least one second electrode. The at least one first electrode may have a first polarity, and the at least one second electrode may have a second polarity as the opposite polarity of the first polarity. For example, the first polarity may have a positive polarity (+), and the second polarity may have a negative polarity (−). However, this is merely illustrative. The first polarity may have the negative polarity (−), and the second polarity may have the positive polarity (+).

In an embodiment, the driving part 140 may drive the electrostatic chuck 130. For example, the driving part 140 may be connected to the electrostatic chuck 130 by the connection member 145, to drive the electrostatic chuck 130.

For example, the driving part 140 may include a power source, and the power source of the driving part 140 may be electrically connected to the electrodes (e.g., the first electrode and the second electrode) included in the electrostatic chuck 130 through the connection member 145. The power source included in the driving part 140 may include one terminal defined as a positive electrode and the other terminal defined as a negative electrode. As the one terminal of the power source is connected to the first electrode of the electrostatic chuck 130 such that a positive polarity voltage is applied to the first electrode through the power source, the first electrode may have the positive polarity. As the other terminal of the power source is connected to the second electrode such that a negative polarity voltage is applied to the second electrode through the power source, the second electrode may have the negative polarity.

A predetermined voltage is applied to the electrostatic chuck 130 through the power source of the driving part 140, so that an electrostatic force can be generated in the electrostatic chuck 130. For example, the predetermined voltage is applied to the first and second electrodes of the electrostatic chuck 130 through the power source of the driving part 140, so that the electrostatic force can be generated. Accordingly, the base substrate BS and the mask 111 can be adhered closely to each other by the electrostatic force. For example, the electrostatic force generated by the electrostatic chuck 130 attracts the base substrate BS and the mask 111 in a direction toward the electrostatic chuck 130 (e.g., the third direction DR3) (e.g., gravitation is generated between the electrostatic chuck 130 and the base substrate BS and/or between the electrostatic chuck 130 and the mask 111), so that the coupling force between the base substrate BS and the mask 111 is increased. Accordingly, the base substrate BS and the mask 111 can be prevented from drooping.

In an embodiment, the driving part 140 may transfer the electrostatic chuck 130 upwardly or downwardly. Also, the driving part 140 may allow the electrostatic chuck 130 to be rotated within a certain angle range, and allow the electrostatic chuck 130 to be linearly moved in various directions with a certain distance range. For example, the driving part 140 may include a device or a structure such as a motor or a cylinder.

The connection member 145 may be in contact with at least a portion of an upper surface (e.g., a first surface SF1) of the electrostatic chuck 130, to connect the electrostatic chuck 130 and the driving part 140 to each other.

The connection member 145 may define an opening OP therein exposing at least a portion of the upper surface (e.g., the first surface SF1) of the electrostatic chuck 130. The plate 150 may be seated on the opening OP defined by the connection member 145. For example, the plate 150 may be seated on the opening OP defined by the connection member 145 to allow the base substrate BS and the mask 111 to be adhered closely to each other.

The plate 150 may be disposed to overlap with the electrostatic chuck 130 in a plan view. The plate 150 may include a yoke plate including a permanent magnet. The plate 150 including the yoke plate is disposed to overlap with the electrostatic chuck 130, so that the base substrate BS and the mask 111 can be further adhered closely to each other by a magnetic force generated by the plate 150 in addition to the above-described electrostatic force generated by the electrostatic chuck 130. For example, the magnetic force generated by the plate 150 attracts the mask 111 made of a metal material in a direction toward the plate 150 (e.g., the third direction DR3) (e.g., gravitation (attracting force) is generated between the plate 150 and the mask 111), so that the coupling force between the base substrate BS and the mask 111 is further increased. Accordingly, the base substrate BS and the mask 111 can be prevented from drooping.

The transfer part DM may be connected to the plate 150. The transfer part DM may include the transfer rod ML and the transfer body MC. The transfer body MC may transfer the plate 150 in the third direction DR3, i.e., a vertical direction through the transfer rod ML. Also, the transfer body MC may allow the plate 150 to be rotated within a certain angle range through the transfer rod ML, and allow the plate 150 to be linearly moved in various directions within a certain distance range through the transfer rod ML.

For example, the transfer body MC may be disposed at the outside of the chamber CH, and include any one of a cylinder and a motor. For example, when the transfer body MC includes the cylinder, the transfer rod ML may be a piston. In another example, when the transfer body MC includes the motor, the transfer rod ML may be implemented as a ball screw shaft which can be vertically moved according to rotation of the motor. However, this is merely illustrative, and the embodiment of the present disclosure is not limited thereto. The transfer part DM may include various devices capable of moving the plate 150.

In an embodiment, the electrostatic chuck 130 and the plate 150 may be driven and/or transferred independently from each other. For example, the electrostatic chuck 130 may be driven and/or transferred by the driving part 140, and the plate 150 may be driven and/or transferred by the transfer part DM. As described above, the electrostatic chuck 130 and the plate 150 are driven and/or transferred independently from each other by different components, so that alignment is prevented from being distorted due to vibration, thereby improving production capability.

The deposition source 160 may be disposed inside the chamber CH. The deposition material may be accommodated inside the deposition source 160.

The deposition source 160 may evaporate, toward the mask 111, at least one deposition material among an organic material, an inorganic material, and a conductive material. The deposition material may be deposited on the deposition area DPA of the base substrate BS while passing through the at least one opening defined in the mask 111. For example, the deposition source 160 may deposit the deposition material on the deposition area DPA of the base substrate BS by using method of heating and evaporating the deposition material at high temperature. In an example, the deposition source 160 may include a heater for heating the deposition material.

Although not shown in FIG. 1, the deposition apparatus 100 may further include a transfer means for moving the deposition source 160 in a horizontal direction (e.g., the first direction DR1 or the second direction DR2).

A nozzle part 165 may be connected to the deposition source 160 to provide the deposition material evaporated or sublimated in the deposition source 160 to the outside. The nozzle part 165 may include at least one nozzle. For example, the nozzle may be provided in the form of dot nozzles which are disposed to be spaced apart from each other and are arranged in a dot form. In another example, the nozzle may be provided in the form of a line nozzle which sprays the deposition material onto a certain area.

Although not shown in FIG. 1, the deposition apparatus 100 may further include a pressure adjusting part. The pressure adjusting part may be connected to the chamber CH to adjust a pressure inside the chamber CH. For example, the pressure adjusting part may include a connection pipe connected to the chamber CH and a pump disposed in the connection pipe, and the connection pipe may be connected to a separate device capable of external pollutant removal.

A process variation and a yield may be problematic according to flatness of the base substrate SB as the deposition target in the deposition process. For example, when the flatness of the base substrate BS as the deposition target in the deposition process is changed, the deposition material is not normally deposited on the deposition area DPA of the base substrate SB. Hence, the process variation is increased, and the yield is decreased. Therefore, the reliability of the deposition process may be deteriorated.

In an example, the support member 120 and the mask frame 112 support only opposite sides (e.g., one side and the other side opposite to the one side) of the mask 111, and therefore, a supporting force for supporting the mask 111 may become weaker as becoming more distant from both the sides of the mask 111. That is, the supporting force for supporting the mask 111 in an upper direction (e.g., the third direction DR3) may become weaker as becoming more distant from both the sides of the mask 111 (or as becoming closer to a central portion of the mask 111). The warpage phenomenon of the mask 111 may occur due to an external force applied to the mask 111. For example, the mask 111, particularly, the central portion of the mask 111 may be warped in a lower direction (or gravity direction) due to gravity applied in the lower direction (e.g., the opposite direction of the third direction DR3) to the mask 111. Accordingly, the base substrate BS disposed on the mask 111 may also be warped in the lower direction. Moreover, as the electrostatic chuck 130 for providing the electrostatic force is disposed on the top of the base substrate SB, the gravity generated by the electrostatic chuck 130 is applied to the base substrate BS and the mask 111, and therefore, the warpage phenomenon of the mask 111 and the base substrate BS may become severer. In addition, as a display device as a deposition target of the deposition apparatus 100 becomes large-sized, sizes of the base substrate BS and the mask 111 become large. Therefore, the warpage phenomenon of the mask 111 and the base substrate BS may become severer.

In order to reduce (e.g., eliminate) such a phenomenon, the electrostatic chuck 130 included in the deposition apparatus 100 in accordance with the embodiments of the present disclosure may include at least one magnetic body MG.

The magnetic body MG is an object having magnetism, and may generate a magnetic force by producing a magnetic field. For example, the magnetic body MG may include a paramagnetic material. However, this is merely illustrative, and the embodiment of the present disclosure is not limited thereto. For another example, the magnetic body MG may include a diamagnetic material.

The magnetic body MG may be provided (or disposed) in an internal groove GRV defined inside the electrostatic chuck 130. For example, the electrostatic chuck 130 may include the first surface SF1 (or the upper surface) and a second surface SF2 (or a lower surface) as the opposite side of the first surface SF1. The first surface SF1 may be the upper surface of the electrostatic chuck 130, which is opposite to the plate 150, and the second surface SF2 may be the lower surface of the electrostatic chuck 130, which is in contact with the base substrate BS. The magnetic body MG may be disposed in the internal groove GRV defined inside the electrostatic chuck 130, corresponding to the side of the first surface SF1 of the electrostatic chuck 130. That is, the magnetic body MG is disposed inside the electrostatic chuck 130, and may be disposed closer to the plate 150. In other words, the magnetic body MG is disposed at certain distances from the first surface SF1 and the second surface SF2 in the third direction DR3, and may be disposed closer to the first surface SF1 than the second surface SF2.

For example, further referring to FIGS. 4A and 4B, the magnetic body MG may be disposed in the internal groove GRV defined inside the electrostatic chuck 130. As shown in FIG. 4B, the internal groove GRV may correspond to a space formed inside the electrostatic chuck 130, and the magnetic body MG may be provided in the internal groove GRV of the electrostatic chuck 130.

In an embodiment, the magnetic body MG may be disposed to overlap with at least a portion of the plate 150 when viewed on a plane (e.g., a surface defined by the first direction DR1 and the second direction DR2) (i.e., in the plan view).

For example, as shown in FIG. 4A, the electrostatic chuck 130 may include a magnetic area MGA, and the magnetic body MB may be disposed in the magnetic area MAG. The magnetic area MGA may correspond to an area overlapping with the plate 150 when viewed on a plane (e.g., a surface defined by the first direction DR1 and the second direction DR2) (i.e., in the plan view) in the first surface SF1 of the electrostatic chuck 130.

As the electrostatic chuck 130 includes the magnetic body MG, a magnetic force in the upper direction (e.g., the third direction DR3) may be generated between the magnetic body MG disposed inside the electrostatic chuck 130 and the plate 150.

More specifically, further referring to FIG. 3, external forces F1 and F2 applied to the mask 111, the electrostatic chuck 130, and the base substrate BS disposed between the mask 111 and the electrostatic chuck 130 are illustrated in FIG. 3. For example, a first external force F1 applied in the lower direction (e.g., the opposite direction of the third direction DR3) to the mask 111, the electrostatic chuck 130, and the base substrate BS and a second external force F2 applied in the upper direction (e.g., the third direction DR3)

to the mask 111, the electrostatic chuck 130, and the base substrate BS are illustrated in FIG. 3.

First, the first external force F1 may be applied in the lower direction (e.g., the opposite direction of the third direction DR3) to the mask 111 and the base substrate BS. The first external force F1 may correspond to a sum of gravities generated by the mask 111, the electrostatic chuck 130, and the base substrate BS, which are described with reference to FIG. 1.

In addition, the second external force F2 may be applied to the upper direction (e.g., the third direction DR3) to the mask 111 and the base substrate BS. The second external force F2 may be a magnetic force generated between the magnetic body MG disposed inside the electrostatic chuck 130 and the plate 150.

For example, since the plate 150 includes the yoke plate including the permanent magnet, a magnetic force (e.g., the second external force F2) may be generated between the plate 150 and the magnetic body MG of the electrostatic chuck 130. In an example, since the permanent magnet includes a ferromagnetic material, the magnetic moment of constituent elements including electrons constituting the magnetic body MG of the electrostatic chuck 130 is aligned by reacting with a magnetic field generated by the plate 150 (e.g., the permanent magnet included in the plate 150), so that the magnetic force, i.e., the second external force F2 can be generated.

Although the first external force F1 is applied in the lower direction (e.g., the opposite direction of the third direction DR3) to the mask 111 and the base substrate BS, the warpage phenomenon of the mask 111 and the base substrate BS can be reduced (e.g., eliminated) by the second external force F2 generated by the plate 150 and the magnetic body MG of the electrostatic chuck 130. For example, a direction in which the first external force F1 is applied to the mask 111 and the base substrate BS and a direction in which the second external force F2 is applied to the mask 111 and the base substrate BS are opposite to each other, the first external force F1 generated by the gravity of the mask 111, the electrostatic chuck 130, and the base substrate BS may be cancelled by the second external force F2 generated by the plate 150 and the magnetic body MG of the electrostatic chuck 130, when an absolute value of the first external force F1 and an absolute value of the second external force F2 are the same. Accordingly, the warpage phenomenon of the mask 111 and the base substrate BS can be reduced (e.g., eliminated). In order to equally set the absolute value of the first external force F1 and the absolute value of the second external value F2, the number, size, position, and/or property of magnetic bodies MG may be determined. This will be described in detail with reference to FIGS. 5 to 7.

In FIG. 4A, it is illustrated that the electrostatic chuck 130 includes three magnetic bodies MG which are consecutively disposed along the first direction DR1 on the magnetic area MGA and are extended long in the second direction DR2. However, the number of magnetic bodies MG included in the electrostatic chuck 130 is not limited thereto.

For example, further referring to FIG. 5, an electrostatic chuck 130_1 may include nine magnetic bodies MG_1 which are consecutively disposed along each of the first direction DR1 and the second direction DR2 and are extended long in the first direction DR1.

As described above, the number of magnetic bodies MG included in the electrostatic chuck 130 may be variously set, and the present disclosure is not limited to the above-described example. For another example, in order to equally set the absolute value of the first external force F1 and the absolute value of the second external value F2, which are described with reference to FIG. 3, the size, number, and the like of magnetic bodies MG included in the electrostatic chuck 130 may be determined.

Hereinafter, for convenience of description, a case where the electrostatic chuck 130 includes three magnetic bodies MG, and the three magnetic bodies MG are disposed side areas and a central area of the magnetic area MGA will be mainly described.

Figure 6:
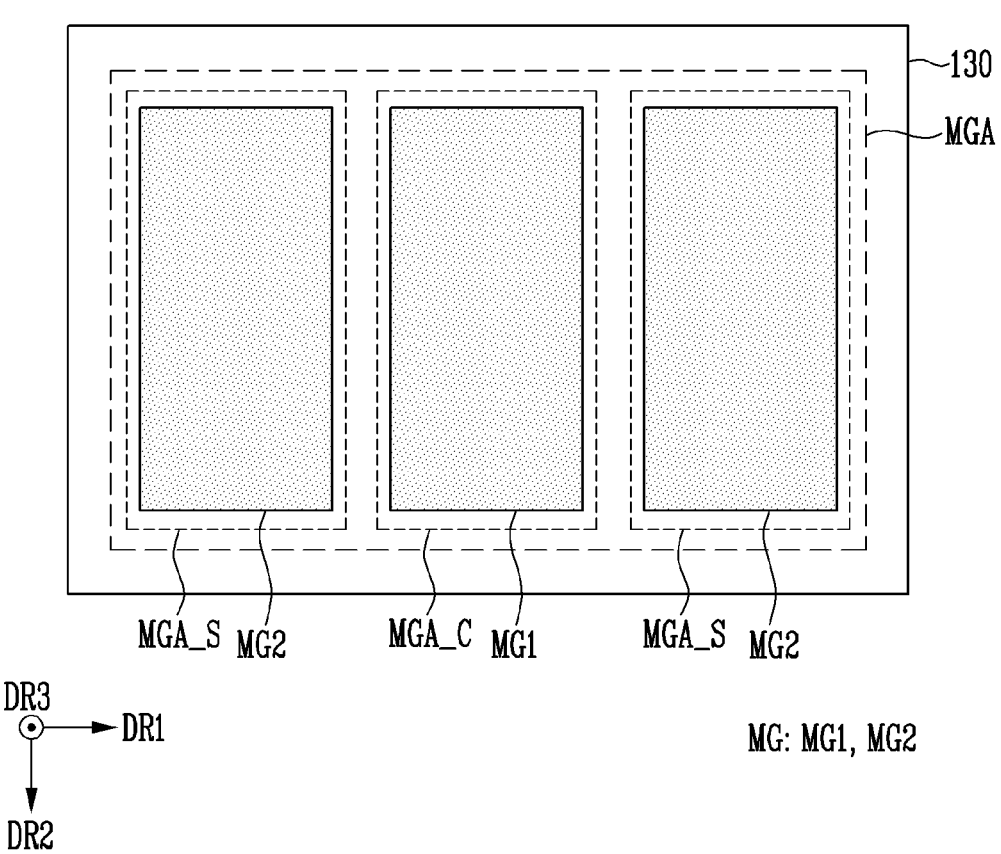
FIG. 6 is a plan view schematically illustrating an example of the electrostatic chuck included in the deposition apparatus shown in FIG. 1.

FIG. 6 is a plan view schematically illustrating an example of the electrostatic chuck included in the deposition apparatus shown in FIG. 1. Here, the "plan view" is a view in the third direction DR3 (i.e., thickness direction of the electrostatic chuck 130). FIG. 6 is a view illustrating in more detail properties of the magnetic body MG included in the electrostatic chuck 130.

Referring to FIGS. 1 to 6, the electrostatic chuck 130 may include magnetic bodies MG disposed on the magnetic area MGA.

The magnetic area MGA may include a first area MGA_C (or central area) and two second areas MGA_S (or side areas) corresponding to opposite portions of the electrostatic chuck 130. The two second areas MGA_S may be disposed on opposite locations with respect to the first area MGA_C in the first direction DR1.

The magnetic body MG may include a first magnetic body MG1 disposed in the first area MGA_C of the magnetic area MGA and second magnetic bodies MG2 disposed in the second areas MGA_S.

In an embodiment, a magnetic property of the first magnetic body MG1 may be stronger than a magnetic property of the second magnetic body MG2. For example, a magnetic permeability and a magnetic susceptibility of the first magnetic body MG1 may be greater than a magnetic permeability and a magnetic susceptibility of the second magnetic body MG2, respectively. As the magnetic permeability of the magnetic body MG becomes larger, the value of a magnetic flux density generated by reacting with an external magnetic field (e.g., a magnetic field generated by the permanent magnet included in the plate 150) becomes larger. As the magnetic susceptibility of the magnetic body MG becomes larger, the magnetization degree of the magnetic body MG, which is generated by the external magnetic field (e.g., the magnetic field generated by the permanent magnet included in the plate 150) becomes larger. Therefore, as the magnetic permeability and the magnetic susceptibility of the magnetic body MG become larger, the magnetic property of the magnetic body MG may become stronger. That is, the magnetic property of the first magnetic body MG1 may be stronger than the magnetic property of the second magnetic body MG2.

Since the magnetic property of the first magnetic body MG1 is stronger than the magnetic property of the second magnetic body MG2, a magnetic force applied to the electrostatic chuck 130 by the plate 150 may be greater in the first area MGA_C than the second area MGA_S. For example, by a difference in magnetic property between the first magnetic body MG1 and the second magnetic body MG2, the magnitude of the second external force F2 (or magnetic force) applied in the upper direction (e.g., the third direction DR3) to the electrostatic chuck 130 may become larger as becoming closer to a central portion from opposite end portions of the electrostatic chuck 130.

As described with reference to FIG. 1, since the support member 120 and the mask frame 112 support only both the sides (e.g., one side and the other side opposite to the one side) of the mask 111, a supporting force for supporting the mask 111 and the base substrate BS in the upper direction (e.g., the third direction DR3) may become weaker as becoming more distant from both the sides of the mask 111 in a case that there is no magnetic bodies MG in the electrostatic chuck 130.

More specifically, the gravity having the substantially same magnitude acts on the mask 111 and the base substrate BS throughout the whole area, but the magnitude of the supporting force in the upper direction (e.g., the third direction DR3), which is generated by the support member 120 and the mask frame 112, decreases as becoming more distant from the support member 120 and the mask frame 112 (i.e., as becoming closer to the central portion of the mask 111 and the base substrate BS). Therefore, a net force (e.g., a net force of the sum of the gravity and the supporting force) in the lower direction (e.g., the opposite direction of the third direction DR3), which acts on the mask 111 and the base substrate BS, may become larger as becoming closer to the central portion of the base substrate BS.

The electrostatic chuck 130 included in the deposition apparatus 100 in accordance with the embodiments of the present disclosure includes the magnetic body having different magnetic properties with respect to areas, so that the net force having the same value (e.g., the net force substantially having a magnitude of 0) can act on the mask 111 and the base substrate BS throughout the whole area of the mask 111 and the base substrate BS.

For example, according to the difference in magnetic property between the first magnetic body MG1 and the second magnetic body MG2, a magnitude of a magnetic force generated corresponding to the first area MGA_C (or central area) is greater than a magnitude of a magnetic force generated corresponding to the second areas MGA_S (or side areas), and hence the net force having the same value (e.g., the net force substantially having a magnitude of 0) can act on the mask 111 and the base substrate BS throughout the whole area of the mask 111 and the base substrate BS. Accordingly, the warpage phenomenon of the mask 111 and the base substrate BS can be more effectively reduced (or eliminated).

Figure 7:
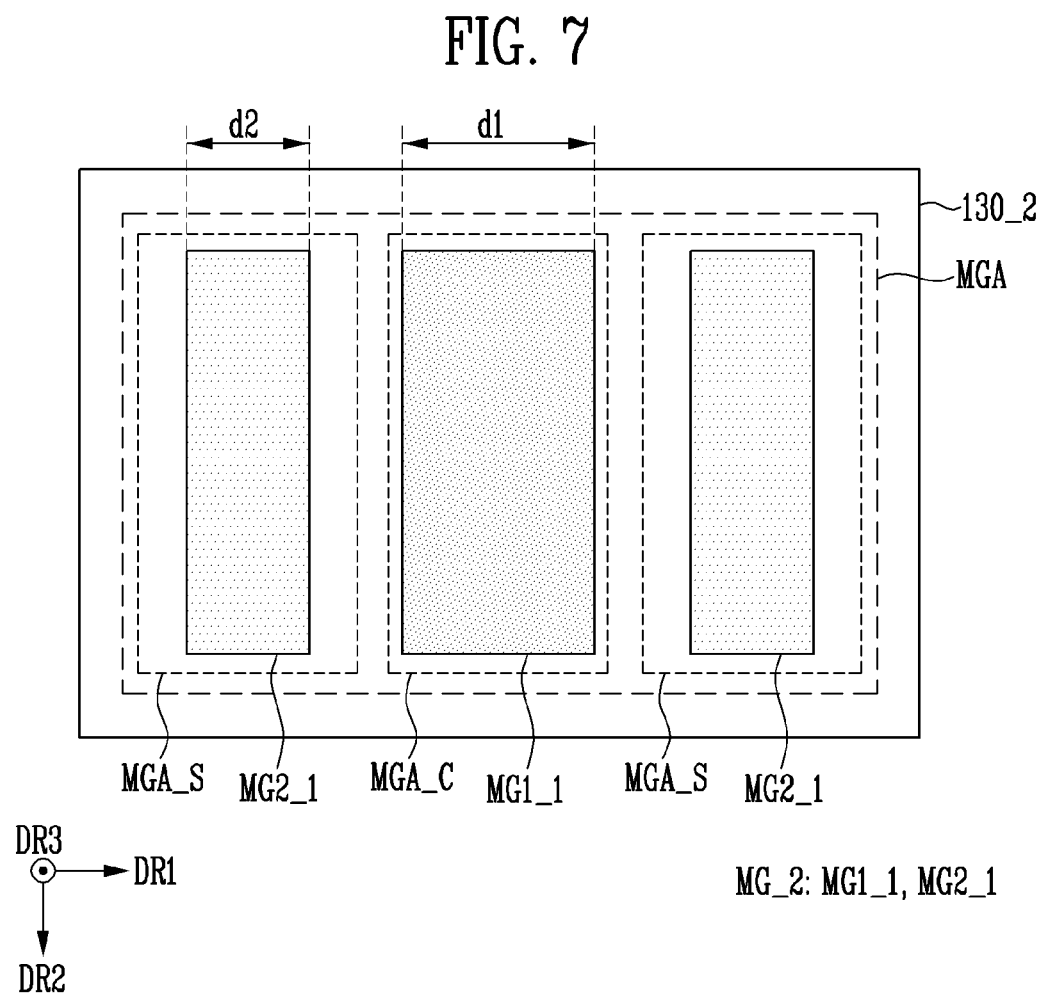

FIG. 7 is a plan view schematically illustrating another example of the electrostatic chuck included in the deposition apparatus shown in FIG. 1. FIG. 7 is a view illustrating in more detail a size of a magnetic body MG_2 included in an electrostatic chuck 130_2.

Referring to FIGS. 1 to 5 and 7, the electrostatic chuck 130_2 may include a magnetic body MG_2 disposed on the magnetic area MGA.

The magnetic body MG_2 may include a first magnetic body MG1_1 disposed in the first area MGA_C and second magnetic bodies MG2_1 disposed in the second areas MGA_S.

In an embodiment, a size (or area) of the first magnetic body MG1_1 may be greater than a size (or area) of the second magnetic body MG2_1 in a plan view. As the size (or area) of the magnetic body MG_2 becomes larger, the magnitude of a magnetic force generated by reacting with an external magnetic field (e.g., a magnetic field generated by the permanent magnet included in the plate 150) may become larger.

Since the size (or area) of the first magnetic body MG1_1 is greater than the size (or area) of the second magnetic body MG2_1 in a plan view, a magnetic force applied to the electrostatic chuck 130_2 by the plate 150 may be greater in the first area MCA_C than the second area MGA_S. For example, the magnitude of the second external force F2 (or magnetic force) applied in the upper direction (e.g., the third direction DR3) to the electrostatic chuck 130_2 may become larger as becoming closer to a central portion from opposite end portions of the electrostatic chuck 130_2.

The electrostatic chuck 130_2 included in the deposition apparatus 100 in accordance with the embodiments of the present disclosure includes the magnetic body MG_2 having different sizes (or areas) with respect to area, so that the net force having the same value (e.g., the net force substantially having a magnitude of 0) can act on the mask 111 and the base substrate BS throughout the whole area of the mask 111 and the base substrate BS.

In an example, the first magnetic body MG1_1 and the second magnetic body MG2_1 may have different lengths of one side (e.g., a side parallel to the first direction DR1). For example, the first magnetic body MG1_1 and the second magnetic body MG2_1 have a rectangular shape, and have the same length of a longitudinal side (e.g., the same length of a side parallel to the second direction DR2). However, the first magnetic body MG1_1 and the second magnetic body MG2_1 may have different lengths of a lateral side (e.g., different lengths of a side parallel to the first direction DR1). For example, a first length d1 of a lateral side of the first magnetic body MG1_1, which is parallel to the first direction DR1, may be longer than a length d2 of a second side of the second magnetic body MG2_1, which is parallel to the first direction DR1. The size (or area) of the first magnetic body MG1_1 may be greater than the size (or area) of the second magnetic body MG2_1 in a plan view.

However, this is merely illustrative, and the shape of the first magnetic body MG1_1 and the second magnetic body MG2_1 is not limited thereto. As long as the size (or area) of the first magnetic body MG1_1 is greater than the size (or area) of the second magnetic body MG2_1, the first magnetic body MG1_1 and the second magnetic body MG2_1 having various shapes may be provided (or disposed) in the electrostatic chuck 130_2. For example, the first magnetic body MG1_1 and the second magnetic body MG2_1 may have different shapes such that the size (or area) of the first magnetic body MG1_1 is greater than the size (or area) of the second magnetic body MG2_1 in a plan view. In another example, the magnetic body (e.g., the first magnetic body MG1_1) is provided (or disposed) in only the first area MGA_C corresponding to a central area of the electrostatic chuck 130_2, and may not be provided (or disposed) in the second area MGA_S corresponding to side areas of the electrostatic chuck 130_2.

Figure 8:
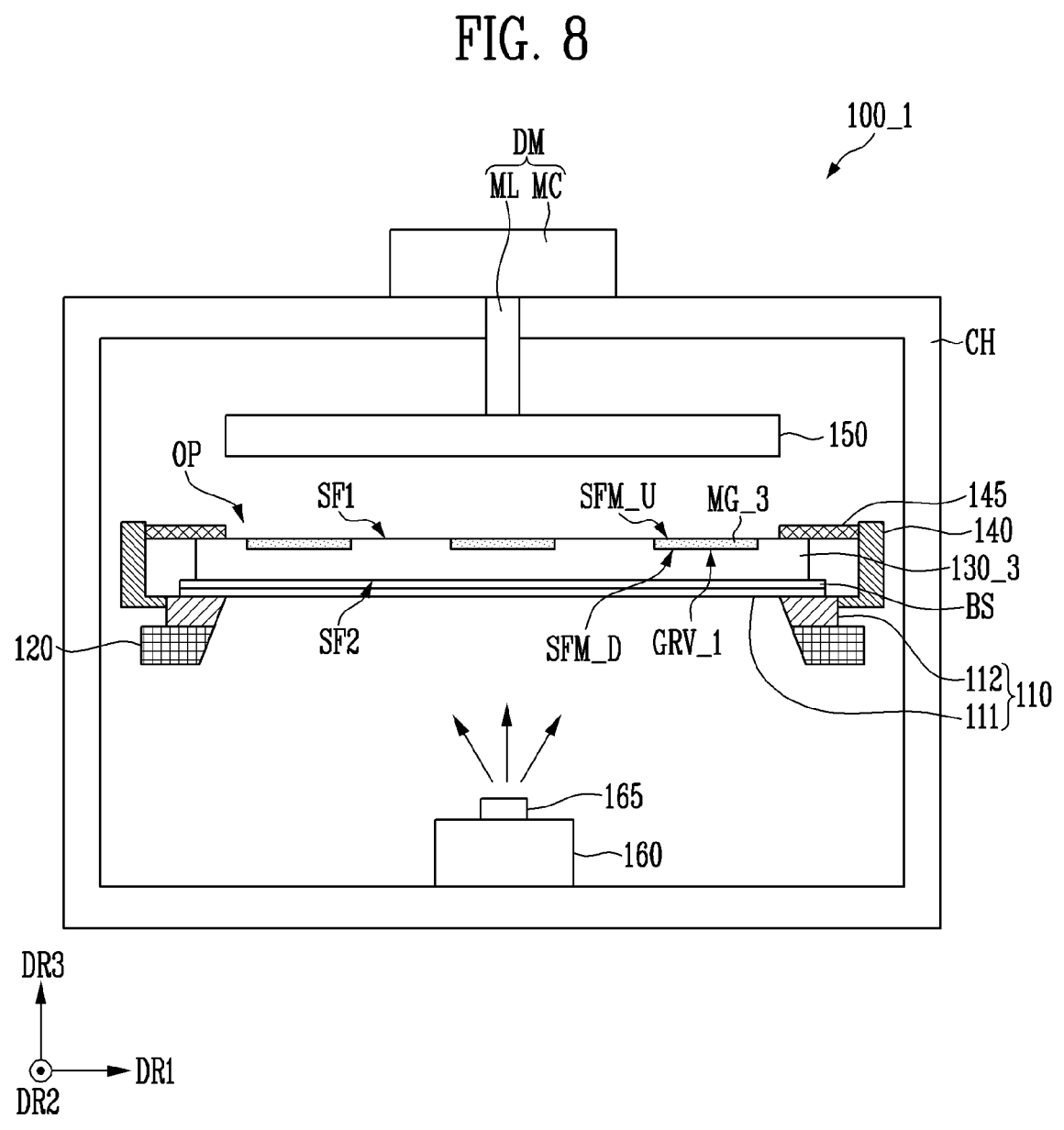

FIG. 8 is a sectional view schematically illustrating a deposition apparatus in accordance with embodiments of the present disclosure.

In FIG. 8, portions different from the portions of the above-described embodiment will be mainly described to avoid redundancy. Portions not particularly described in the embodiment shown in FIG. 8 follow those of the above-described embodiment. In addition, identical reference numerals refer to identical components, and similar reference numerals refer to similar components.

FIG. 8 illustrates a modified embodiment of the embodiment shown in FIG. 1 in relation to the position at which a magnetic body MG_3 is provided (or disposed).

Referring to FIGS. 1 and 8, the deposition apparatus 100_1 may include a chamber CH, a transfer part DM, a mask assembly 110, a support member 120, an electrostatic chuck 130_3, a driving part 140, a connection member 145, a plate 150, and a deposition source 160.

The magnetic body MG_3 may be provided (or disposed) in an internal groove GRV_1 defined inside the electrostatic chuck 130_3.

In an embodiment, the magnetic body MG_3 is provided (or disposed) in the internal groove GRV_1 of the electrostatic chuck 130_3, and may be provided (or disposed) adjacent to an upper surface (e.g., a first surface SF1) of the electrostatic chuck 130_3.

For example, the magnetic body MG_3 may include a third surface SFM_U (or upper surface) and a fourth surface SFM_D (or lower surface), and the third surface SFM_U of the magnetic body MG_3 may be in contact with the first surface SF1 of the electrostatic chuck 130_3. That is, a plane defined by the third surface SFM_U of the magnetic body MG_3 and a plane defined by the first surface SF1 of the electrostatic chuck 130_3 may be the same plane. In other words, the third surface SFM_U of the magnetic body MG_3 and the first surface SF1 of the electrostatic chuck 130_3 may exist on the same plane, and the third surface SFM_U of the magnetic body MG_3 may be aligned with the first surface SF1 of the electrostatic chuck 130_3.

The magnetic body MG_3 is provided (or disposed) adjacent to the upper surface (e.g., the first surface SF1) of the electrostatic chuck 130_3, and therefore, a distance between the magnetic body MG_3 and the plate 150 may decrease compared to the embodiment in FIG. 1. The magnitude of a magnetic force generated between the magnetic body MG_3 and the plate 150 may increase. Accordingly, although the magnetic body MG_3 having a relatively small size (or area) is used and/or although the magnetic body MG_3 having a relatively weak magnetic property is used compared to the embodiment in FIG. 1, a magnetic force having a sufficient magnitude can be generated between the magnetic body MG_3 and the plate 150. Accordingly, cost of the deposition process can be saved.

Figure 9:
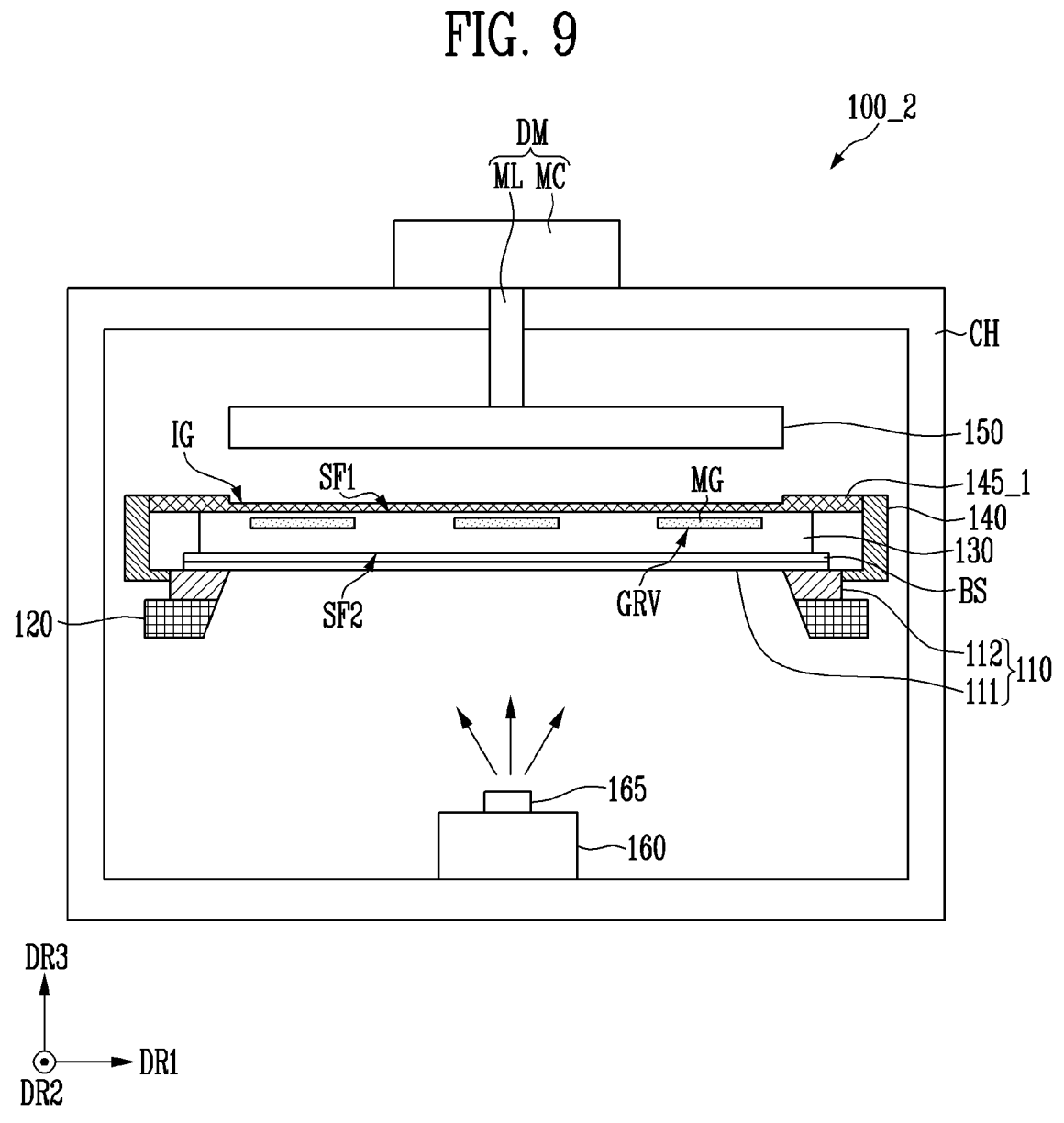

FIG. 9 is a sectional view schematically illustrating a deposition apparatus in accordance with embodiments of the present disclosure.

In FIG. 9, portions different from the portions of the above-described embodiment will be mainly described to avoid redundancy. Portions not particularly described in the embodiment shown in FIG. 9 follow those of the above-described embodiment. In addition, identical reference numerals refer to identical components, and similar reference numerals refer to similar components.

FIG. 9 illustrates a modified embodiment of the embodiment shown in FIG. 1 in relation to a connection member 145_1.

Referring to FIGS. 1 and 9, the deposition apparatus 100_2 may include a chamber CH, a transfer part DM, a mask assembly 110, a support member 120, an electrostatic chuck 130, a driving part 140, a connection member 145_1, a plate 150, and a deposition source 160.

The connection member 145_1 may cover and be in contact with an upper surface (e.g., a first surface SF1) of the electrostatic chuck 130, to connect the electrostatic chuck 130 and the driving part 140 to each other.

In an embodiment, the connection member 145_1 may not expose the upper surface (e.g., the first surface SF1) of the electrostatic chuck 130. The connection member 145_1 may be coupled to the upper surface (e.g., the first surface SF1) of the electrostatic chuck 130.

In an embodiment, the connection member 145_1 may define a groove part IG therein on which the plate 150 is seated. The plate 150 is seated on the groove part IG provided in the connection member 145_1 to allow a base substrate BS and a mask 111 to be adhered closely to each other.

15

Figure 10:
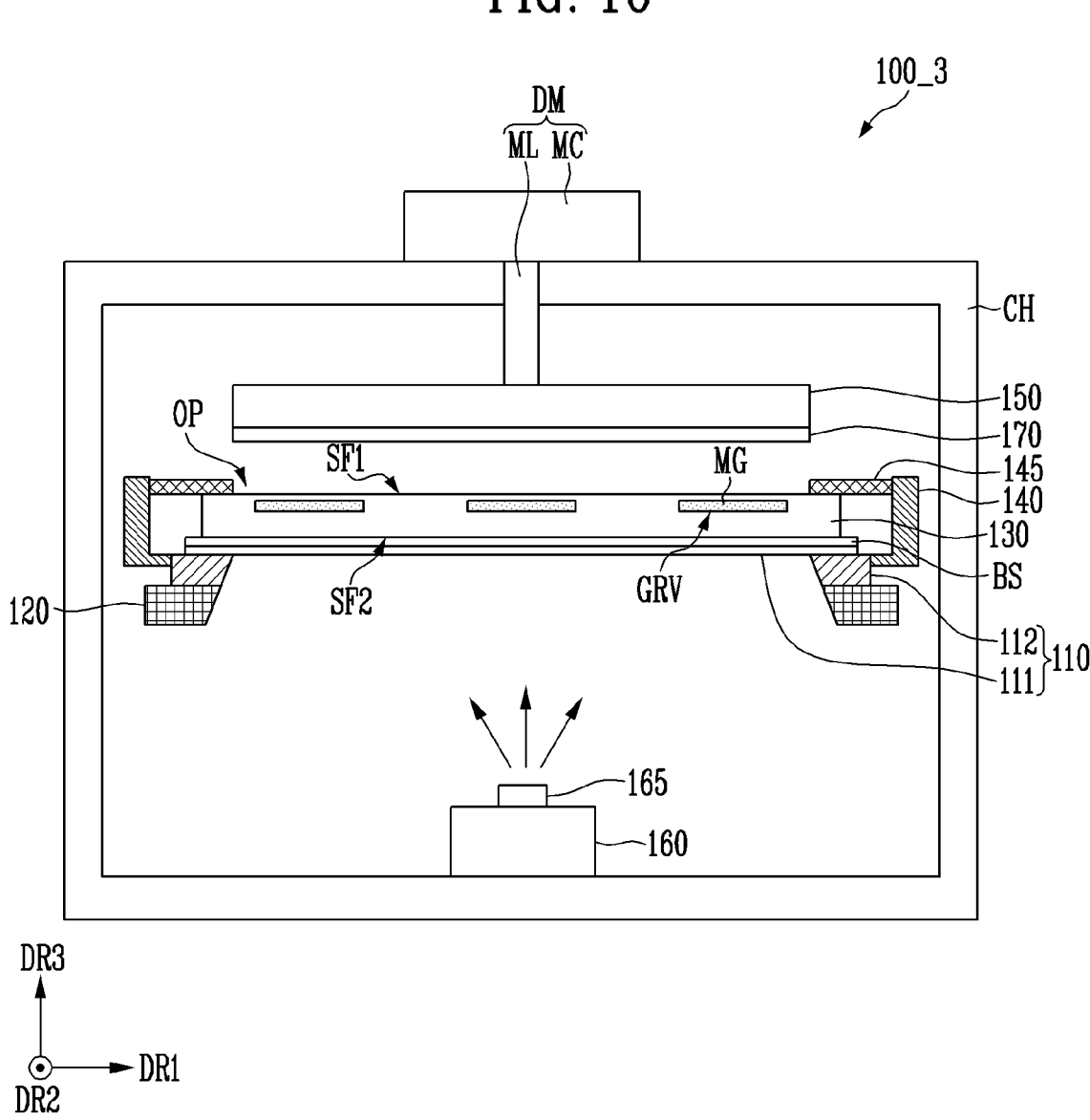
FIG. 10 is a sectional view schematically illustrating a deposition apparatus in accordance with embodiments of the present disclosure.

FIG. 10 is a sectional view schematically illustrating a deposition apparatus in accordance with embodiments of the present disclosure.

In FIG. 10, portions different from the portions of the above-described embodiment will be mainly described to avoid redundancy. Portions not particularly described in the embodiment shown in FIG. 10 follow those of the above-described embodiment. In addition, identical reference numerals refer to identical components, and similar reference numerals refer to similar components.

FIG. 10 illustrates a modified embodiment of the embodiment shown in FIG. 1 in relation to an auxiliary plate 170.

Referring to FIGS. 1 and 1, the deposition apparatus 100_3 may include a chamber CH, a transfer part DM, a mask assembly 110, a support member 120, an electrostatic chuck 130, a driving part 140, a connection member 145, a plate 150 (or first plate), and a deposition source 160.

In an embodiment, the deposition apparatus 100_3 may further include an auxiliary plate 170 (or second plate) provided between the electrostatic chuck 130 and the plate 150 compared to the embodiment in FIG. 1. For example, the auxiliary plate 170 may be coupled to one surface (e.g., a lower surface) of the plate 150.

The auxiliary plate 170 may be disposed between the electrostatic chuck 130 and the plate 150 to pressurize a base substrate BS with self-weight. For example, the auxiliary plate 170 can improve the close adhesion between the base substrate BS and a mask 111 by pressurizing the base substrate BS with the self-weight before a magnetic force is applied to the mask 111 as the plate 150 is moved toward the base substrate BS.

In accordance with the present disclosure, the deposition apparatus includes an electrostatic chuck (ESC) including at least one magnetic body. Accordingly, a warpage phenomenon of a mask and a base substrate as a deposition target is reduced (or eliminated) by a magnetic force generated between the magnetic body of the electrostatic chuck and a plate, so that a process variation and a yield can be improved.

Also, in accordance with the present disclosure, the electrostatic chuck included in the deposition apparatus includes a magnetic body having different magnetic properties and/or different sizes with respect to areas, so that a net force having the same value (e.g., a net force substantially having a magnitude of 0) can act on the mask and the base substrate throughout the whole area of the mask and the base substrate. Accordingly, the warpage phenomenon of the mask and the base substrate can be more effectively reduced (or eliminated).

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A deposition apparatus for depositing a deposition material on a base substrate disposed on a mask, the deposition apparatus comprising:

a mask assembly including a mask frame which defines an opening therein and surrounds the opening, and the mask disposed on the mask frame;

an electrostatic chuck disposed on the base substrate; and a plate disposed on the electrostatic chuck, wherein the plate and the electrostatic chuck are independently movable from each other, wherein the plate includes a permanent magnet, and the electrostatic chuck includes a plurality of magnetic bodies, and wherein a magnetic property of at least one magnetic body among the plurality of magnetic bodies is different from a magnetic property of remaining magnetic bodies except for the at least one magnetic body among the plurality of magnetic bodies.

2. The deposition apparatus of claim 1, wherein the electrostatic chuck includes a magnetic area, and wherein the magnetic area includes:

a first area corresponding to a central area of the magnetic area; and a second area disposed at one side of the first area.

3. The deposition apparatus of claim 2, wherein the plurality of magnetic bodies includes a first magnetic body disposed in the first area and a second magnetic body disposed in the second area, and wherein a magnetic property of the first magnetic body is greater than a magnetic property of the second magnetic body.

4. The deposition apparatus of claim 3, wherein a magnetic permeability of the first magnetic body is greater than a magnetic permeability of the second magnetic body.

5. The deposition apparatus of claim 3, wherein a magnetic susceptibility of the first magnetic body is greater than a magnetic susceptibility of the second magnetic body.

6. The deposition apparatus of claim 2, wherein, in a plan view, the magnetic area overlaps with the plate.

7. The deposition apparatus of claim 1, wherein the electrostatic chuck defines a plurality of internal grooves therein, and wherein the magnetic bodies are disposed in the internal grooves, respectively.

8. The deposition apparatus of claim 1, wherein the electrostatic chuck includes a first surface facing the plate and a second surface opposite to the first surface, and wherein the magnetic bodies are disposed closer to the first surface than the second surface.

9. The deposition apparatus of claim 8, wherein the magnetic bodies are disposed spaced apart from the first surface at a certain distance.

10. The deposition apparatus of claim 8, wherein each of the magnetic bodies includes a third surface facing the plate and a fourth surface opposite to the third surface, and wherein the third surface and the first surface are coplanar.

11. The deposition apparatus of claim 1, wherein a size of each of the at least one magnetic body is different from a size of each of the remaining magnetic bodies.

12. A deposition apparatus for depositing a deposition material on a base substrate disposed on a mask, the deposition apparatus comprising:

a mask assembly including a mask frame which defines an opening therein and surrounds the opening, and the mask disposed on the mask frame;

an electrostatic chuck disposed on the base substrate; and a plate disposed on the electrostatic chuck, wherein the plate and the electrostatic chuck are independently movable from each other, wherein the plate includes a permanent magnet, and the electrostatic chuck includes a plurality of magnetic bodies, and wherein a size of each of at least one magnetic body among the plurality of magnetic bodies is different from a size of each of remaining magnetic bodies except for the at least one magnetic body among the plurality of magnetic bodies.

13. The deposition apparatus of claim 12, wherein the electrostatic chuck includes a magnetic area, and wherein the magnetic area includes:

a first area corresponding to a central area of the magnetic area; and a second area disposed at one side of the first area.

14. The deposition apparatus of claim 13, wherein the plurality of magnetic bodies includes a first magnetic body disposed in the first area and a second magnetic body disposed in the second area, and wherein a size of the first magnetic body is greater than a size of the second magnetic body.

15. The deposition apparatus of claim 13, wherein, in a plan view, the magnetic area overlaps with the plate.

16. The deposition apparatus of claim 13, wherein the electrostatic chuck includes a first surface facing the plate and a second surface opposite to the first surface, and wherein the magnetic bodies are disposed closer to the first surface than the second surface.

17. The deposition apparatus of claim 16, wherein the magnetic bodies are disposed spaced apart from the first surface at a certain distance.

18. The deposition apparatus of claim 16, wherein each of the magnetic bodies includes a third surface facing the plate and a fourth surface opposite to the third surface, wherein the third surface and the first surface are coplanar.

19. The deposition apparatus of claim 12, wherein a magnetic property of the at least one magnetic body is different from a magnetic property of the remaining bodies.

* * * * *